(12) United States Patent
Bachman et al.

(10) Patent No.: US 9,601,280 B2
(45) Date of Patent: Mar. 21, 2017

(54) MICRO ELECTROMAGNETICALLY ACTUATED LATCHED SWITCHES

(71) Applicant: THE REGENTS OF THE UNIVERSITY OF CALIFORNIA, Oakland, CA (US)

(72) Inventors: Mark Bachman, Irvine, CA (US); Guann-Pyng Li, Irvine, CA (US); Yang Zhang, Irvine, CA (US); Minfeng Wang, Irvine, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 80 days.

(21) Appl. No.: 14/547,426

(22) Filed: Nov. 19, 2014

(65) Prior Publication Data

US 2015/0294823 A1    Oct. 15, 2015

Related U.S. Application Data

(63) Continuation of application No. PCT/US2013/031980, filed on Mar. 15, 2013.

(60) Provisional application No. 61/655,939, filed on Jun. 5, 2012.

(51) Int. Cl.
*H01H 1/00* (2006.01)
*B81B 3/00* (2006.01)
*H01H 50/00* (2006.01)

(52) U.S. Cl.
CPC ......... *H01H 1/0036* (2013.01); *B81B 3/0054* (2013.01); *H01H 50/005* (2013.01); *B81B 2201/016* (2013.01); *H01H 2001/0042* (2013.01)

(58) Field of Classification Search
CPC ........ H01H 50/32; H01H 50/58; H01H 51/22; H01H 50/005; H01H 50/44; H01H 2001/0042; B81B 3/0054; B81B 2201/016
See application file for complete search history.

(56) References Cited

U.S. PATENT DOCUMENTS 5,475,353 A * 12/1995 Roshen ............... H01H 50/005
                                                 200/512
5,921,382 A *  7/1999 Retter .................... H01H 13/70
                                                 200/5 A (Continued)

FOREIGN PATENT DOCUMENTS

JP    2009-224113      10/2009
KR    10-2010-0070810   6/2010

(Continued)

*Primary Examiner* — Mohamad Musleh
(74) *Attorney, Agent, or Firm* — One LLP

(57) ABSTRACT

Micro-electromagnetically actuated latched miniature relay switches formed from laminate layers comprising a spring and magnet, electromagnetic coils, magnetic latching material, and transmission line with contacts. Preferably the miniature relay switches transmit up to about 50 W of DC or AC line power, and carry up to about 10 A of load current, with an overall volume of less than about 100 mm³. In addition to switching large power, the device preferably requires less than 3 V to actuate, and has a latching feature that retains the switch state after actuation without the need for external applied voltage or current.

20 Claims, 9 Drawing Sheets

(56) References Cited

U.S. PATENT DOCUMENTS

| | | | |
|---|---|---|---|
| 6,084,281 A * | 7/2000 | Fullin | H01H 50/005 |
| | | | 257/421 |
| 7,084,724 B2 | 8/2006 | Cetiner et al. | |
| 7,541,898 B2 | 6/2009 | Qian et al. | |
| 8,877,074 B2 | 11/2014 | Bachman et al. | |
| 2004/0183633 A1 | 9/2004 | Shen et al. | |
| 2006/0049900 A1 | 3/2006 | Ruan et al. | |
| 2006/0114084 A1 | 6/2006 | Ruan et al. | |
| 2008/0170727 A1 | 7/2008 | Bachman et al. | |
| 2010/0171577 A1 * | 7/2010 | Christenson | H01H 1/66 |
| | | | 335/180 |
| 2011/0037542 A1 * | 2/2011 | Page | H01H 49/00 |
| | | | 335/78 |
| 2012/0103768 A1 * | 5/2012 | Bachman | H01H 59/0009 |
| | | | 200/181 |
| 2012/0279845 A1 * | 11/2012 | Bachman | H03K 17/975 |
| | | | 200/600 |

FOREIGN PATENT DOCUMENTS

| | | |
|---|---|---|
| WO | WO PCT/US2013/031980 | 7/2013 |
| WO | WO PCT/US2013/031980 | 12/2014 |

* cited by examiner

MICRO ELECTROMAGNETICALLY ACTUATED LATCHED SWITCHES

CROSS-REFERENCE TO RELATED APPLICATIONS

This application is a continuation of PCT Application No. PCT/US2013/031980, filed Mar. 15, 2013, which claims priority to U.S. Provisional Application No. 61/655,939, filed Jun. 5, 2012, which applications are incorporated herein by reference.

FIELD

The embodiments described herein generally relate to relay switches and more particularly, to electromagnetically actuated latched miniature relay switches and manufacturing techniques to facilitate manufacturing in large volumes or embedding in other electronic packages.

BACKGROUND INFORMATION

The demand in distributed power management and power-efficient alternatives is calling for a new wave of power control devices. Ready for higher level integration, these new elements include micro sensors and micro actuators to realize close-loop control of complex systems. For energy intensive applications, such as home and business appliances, lighting, solar energy and automotive, high voltage and/or high current circuit control devices play a critical role. Traditional macro-machined relays, micro electro-mechanical switches and semiconductor relays are not best suited for the aforementioned applications. In particular, inter solar panel routing, smart power measuring, and industrial lighting all require small, embeddable relays. These emerging applications currently do not have suitable products for their needs.

Electro-mechanical relays and switches are in almost every major electrical system, especially those requiring moderate power (>10 w), such as automotive, industrial, residential, commercial power, and lighting. Macro-machined and assembled electromagnetic relays are limited in miniaturization and integration. Although reliable industrial solutions, current high current contact relays are difficult to fit in a package 3000 mm$^3$ or smaller. The design approach of traditional coil winding and contact switch assembly intrinsically limits further miniaturization.

Although truly small in size, traditional micro electromechanical switches have faced major challenges in high power applications (>10 W). They are difficult to design using conventional silicon technology. Silicon MEMS devices (and their close variants, such as electro-formed metal devices) generally result in closely spaced, fragile elements. Most switches use electrostatic actuation to move the switch arm into contact with the mating electrical contact. This can only be done if the switch arm is close to the actuating mechanism, and if the actuation force is small. However, for high power applications, this is unacceptable. Power coupling across the small gap between conductors is appreciable at high power, self-charging occurs at high power resulting in self-actuating switches (the "hot switch" effect), and high power applications require that high current be passed through the conducting elements, which would destroy the thin membranes.

Solid-state relays (SSR) use a small control signal, usually optically isolated, to control a larger load current or voltage. SSRs have fast switching times of the order of microseconds to milliseconds as well as lower latching current of tens of milliamps. However, the relatively higher insertion loss at "close" and the reverse leakage current at "open" both prevent SSRs from becoming the most energy efficient power management device.

SUMMARY

The embodiments provided herein are directed to micro mechanical relay switches and more particularly, to electromagnetically actuated latched micro relay switches. Preferably the miniature relay switches transmit up to about 50 W of DC or AC line power, and carry up to about 10 A of load current, with an overall volume of less than about 100 mm$^3$. In addition to switching large power, the device preferably requires less than 3 V to actuate, and has a latching feature that retains the switch state after actuation without the need for external applied voltage or current. The embodiments also relate to methods of manufacturing such relay devices directly within or on any of the following: lead frames, substrates, microelectronic packages, printed circuit boards, flex circuits, and rigid-flex materials.

The illustrative embodiments use printed circuit boards and laminates to build MEMS relay devices, which are ideally suited to the needs of high power applications, since they allow the creation of rugged, highly conductive contacts, and allow relatively easy integration of alternative technologies such as magnetic components for electromagnetic actuation. These small sized devices employ an electromagnetic actuation component that directs electric current through another contact in the "on" state, or provides an open circuit in the "off" state. The device requires low voltage to actuate, and requires zero power to maintain either the "on" or "off" state (latching).

In one embodiment a movable component having a spring and magnet in a laminate layer is the main element of a single pole, single throw (SPST) electromagnetic micro relay. The movable component may be actuated by a mechanism, such as electromagnetic actuation through the use of a coil in a laminate. If the tethered magnet is pulled close enough to the bottom region, a magnetic material in a laminate layer, such as a thin layer of nickel, will hold the magnet down, thus latching it into the "on" state. The cantilever contains a conductive element coated on the surface so it can act as an electric switch that connects two or more electrodes. The device is driven into a latched "on" state by using a pulsed current through the coil. The device is also de latched by reversing the current pulse, thus creating reversed magnetic force to pull the magnet away from the bottom. The magnet then latches on to the top magnetic material to establish the "off" state of the switch.

The systems, methods, features and advantages of the invention will be or will become apparent to one with skill in the art upon examination of the following figures and detailed description. It is intended that all such additional methods, features and advantages be included within this description, be within the scope of the invention, and be protected by the accompanying claims. It is also intended that the invention is not limited to require the details of the example embodiments.

BRIEF DESCRIPTION OF DRAWINGS

The accompanying drawings, which are included as part of the present specification, illustrate the presently preferred embodiment and, together with the general description given above and the detailed description of the preferred embodiment given below, serve to explain and teach the principles of the present invention.

Figure 1:
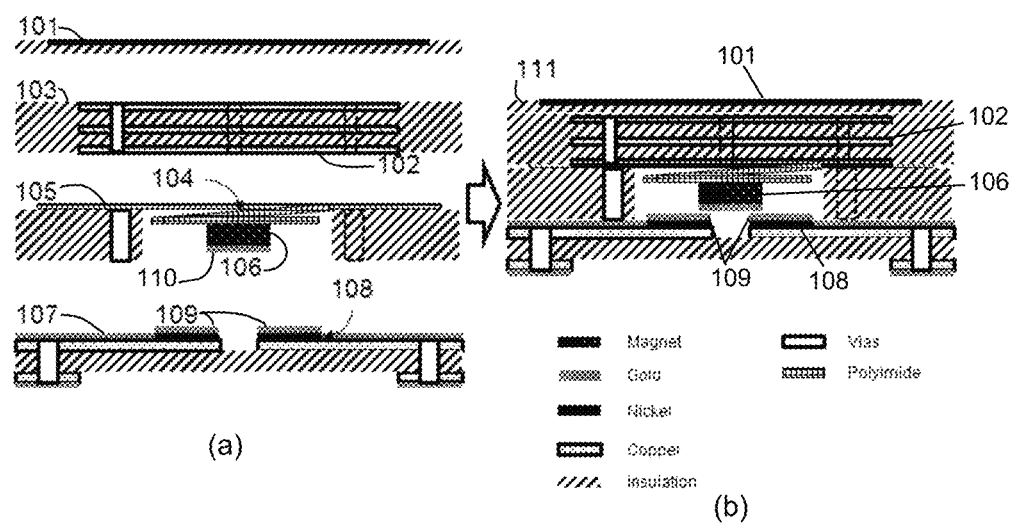
FIG. 1 is a cross-sectional view of (a) an exploded assembly of laminate layers and (b) an assembly of laminate layers of an embodiment of a SPST electromagnetic micro relay that shows all the basic components and corresponding materials.

It should be noted that the figures are not necessarily drawn to scale and that elements of similar structures or functions are generally represented by like reference numerals for illustrative purposes throughout the figures. It also should be noted that the figures are only intended to facilitate the description of the various embodiments described herein. The figures do not necessarily describe every aspect of the teachings disclosed herein and do not limit the scope of the claims.

DESCRIPTION

The embodiments provided herein are directed to the micro mechanical relay switches and more particularly, to electromagnetically actuated latched miniature relay switches. Preferably the miniature relay switches transmit up to about 50 W of DC or AC line power, and carry up to about 10 A of load current, with an overall volume of less than about 100 mm$^3$. In addition to switching large power, the device preferably requires less than 3 V to actuate, and has a latching feature that retains the switch state after actuation without the need for external applied voltage or current. The embodiments also relate to methods of manufacturing such relay devices directly within or on any of the following: lead frames, substrates, microelectronic packages, printed circuit boards, flex circuits, and rigid-flex materials.

The embodiments refer to several techniques already disclosed in the following applications, which are incorporated by reference: application Ser. No. 12/112,925: "Methods of manufacturing microdevices in laminates, lead frames, packages, and printed circuit boards;" application Ser. No. 11/956,756: "Acoustic substrate;" application Ser. No. 11/849,914: "High-Isolation Tunable MEMS Capacitive Switch;" application Ser. No. 10/751,131: "MEMS Fabrication on a Laminated Substrate."

Since all relays will be eventually mounted on a substrate, such as a printed circuit board, for system integration, it is preferable to design and build them directly within a printed circuit board. The illustrative embodiments use printed circuit boards and laminates to build MEMS relay devices, which are ideally suited to the needs of high power applications, since they allow the creation of rugged, highly conductive contacts, and allow relatively easy integration of alternative technologies such as magnetic components for electro-magnetic actuation. These small sized devices employ an electromagnetic actuation component that directs electric current through another contact in the "on" state, or provides an open circuit in the "off" state. The device requires low voltage to actuate, and requires zero power to maintain either the "on" or "off" state (latching). The finished devices are automatically packaged within a printed circuit board, whether singulated or panelized.

The embodiments of this disclosure introduce a micro electromechanical relay fabricated directly within printed circuit boards for moderate to high power applications. These devices simultaneously possess features that are missing in other solutions, such as high power handling, embeddable small form factor, low insertion loss, high isolation, low voltage actuation and zero-power latching. In a detailed comparison against existing relay devices (see Table 1 below), the embodiments described herein have an advantage on most features as standalone devices. Collectively, embedded arrays and networks of these devices would show further benefits in larger scaled applications.

TABLE 1

Comparison Matrix Of The Present Disclosure Versus Existing Solutions

|  | Macro-machined Relays | MEMS Switches | Solid State relays | Present embodiment |
| --- | --- | --- | --- | --- |
| Typical load current | 20 A | 1 A | 20 A | 20 A |
| Typical switching current | 120 V | 10 V | 120 V | 120 V |
| Contact resistance | 3 mOhm | 1 Ohm | N/A | 0.2 Ohm |
| Leakage current | 0 | 0 | 7 mA | 0 |
| Form factor | 20 × 20 × 10 | 0.5 × 0.5 × 0.5 | 50 × 50 × 10 | 5 × 5 × 4 |
| Switching speed | 100 ms | 25 us | 0.1-1 ms | 100 ms |
| Control voltage/current | 12 V/0.1 A | 50 V | 3 V/3 mA | 3 V/1 A |
| Latching | N | N | N | N |

Devices in accordance with the embodiments described herein are fundamentally different from existing products in both design and fabrication technology. For instance, micro devices in accordance with the embodiments described herein employ an electromagnetic actuation mechanism that drives a permanent magnet with highly conductive alloy to reach different states of the relay. The magnet latches to paramagnetic materials at each state and no power is needed to maintain the state once established. For example, in a single throw single pole relay, the conductive coating directs electric current through two adjacent contacts in the "on" state, or provides an open circuit in the "off" state.

Turning to the figures, as shown in FIG. 1, a movable component 100 having a spring 104 and magnet 106 in a laminate layer 105 is the main element of a single pole, single throw (SPST) electromagnetic micro relay 111. The movable component 104 may be actuated by a mechanism, such as electromagnetic actuation through the use of a coil 102 in a laminate 103. If the tethered magnet 106 is pulled close enough to the bottom region, a magnetic material 108 in a laminate layer 107, such as a thin layer of nickel, will hold the magnet down, thus latching it into the "on" state. The cantilever contains a conductive element 110 coated on the surface so it can act as an electric switch that connects two or more electrodes 109. The device 111 is driven into a latched "on" state by using a pulsed current through the coil. The device 111 is also delatched by reversing the current pulse, thus creating reversed magnetic force to pull the magnet 106 away from the bottom. The magnet 106 then latches on to the top magnetic material 101 to establish the "off" state of the switch.

Figure 2:
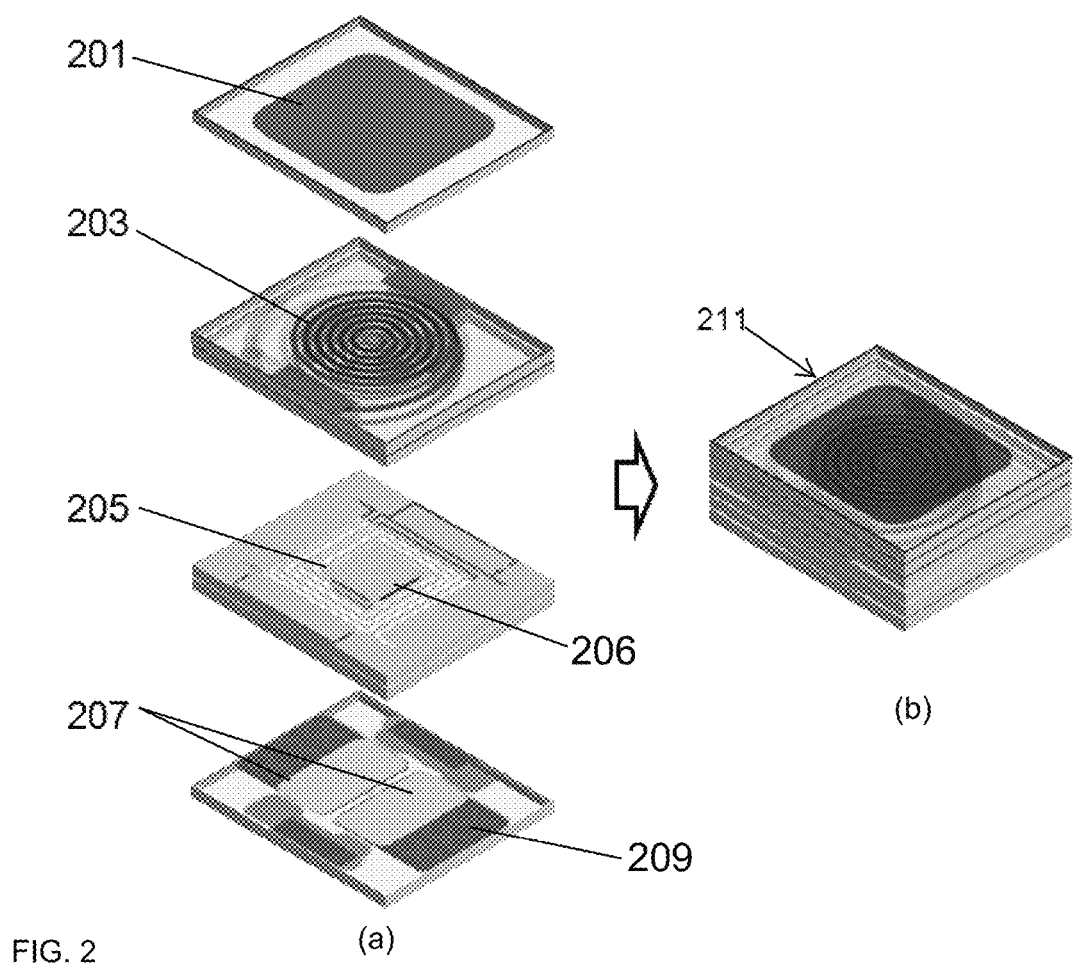
FIG. 2 is an isometric view of (a) an exploded assembly of laminate layers and (b) an assembly of laminate layers of the embodiment show in FIG. 1.

As shown in FIG. 2, the laminates layers contain different mechanical and electrical mechanisms, such as the movable spring load 205 with a permanent magnet 206 coupled to the spring load 205, the electromagnetic coil 203, the contact electrodes 207 coupled to a transmission line 209, and the magnetic material 201. All layers are laminated together to form a complete assembly with the mechanical elements enclosed in a package 211. Conductive adhesives, such as solder paste and conductive epoxy, and non-conductive adhesives, such as pre-impregnated composite fibers and epoxy, are utilized at selective locations to satisfy different bonding requirements.

In one preferred embodiment, the preferred elements of the device are 1) two multi-turn, six layer coils 203 produced in a 12-layer laminate to provide an electromagnetic actuation force; 2) a polyimide spring 205 which holds a 1 mm×0.25 mm gold-plated, neodymium permanent magnet 206 with a polished surface; 3) a transmission/signal line 209 with nickel-gold contact pads 207; and 4) nickel plated regions 201 on the top and under the contact pads to provide magnetic latching. Other elements include structural layers to hold elements and provide open space for the armature to move, and electrical vias.

During normal "OFF" operation, the permanent magnet remains latched to the top of the device, held in place by magnetic attraction to the top nickel plate. During actuation to "ON" state, a low voltage, high current pulse is passed through the coils producing an electromagnetic force ~3 mN on the magnet and moving it towards the bottom plate, which contains a transmission/signal line that is designed with an open gap. When sufficiently close, the nickel plate on the bottom attracts the magnet causing it to. After this, the coil is completely de-energized. The polished gold coated magnet makes electrical contact with two polished gold contact pads on the transmission/signal line and places the switch in the "ON" position. To actuate the device into the "OFF" state, a reverse current pulse is sent through the coils, causing the magnet to move back up and latch to the top plate.

Figure 3:
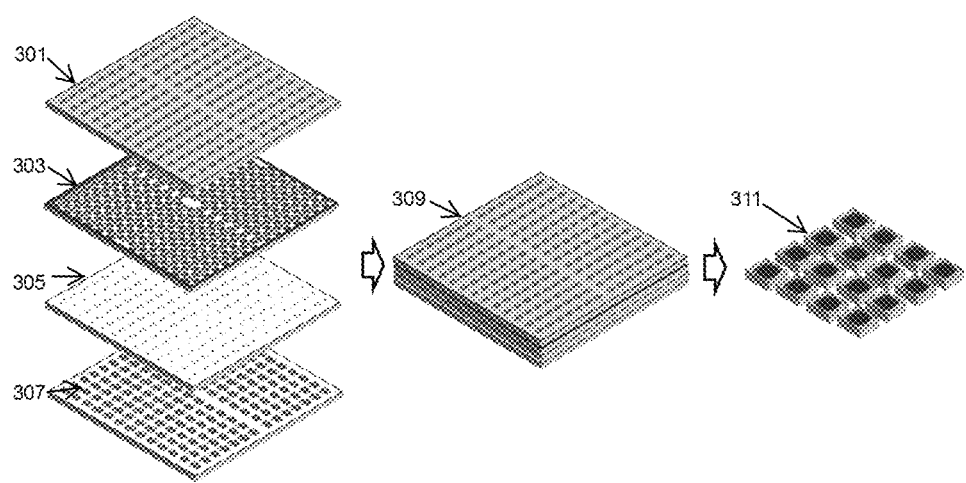
FIG. 3 illustrates a laminate panel process for building micro relays at large scale by laminate panels.

Turning to FIG. 3, the laminate panel process enables large scale production of hundreds or thousands of micro relays. Laminate panels (FIG. 3(a)) of movable spring loads 305, electromagnetic coils 303, contact electrodes 307, and magnetic material 301 (301-307) are laminated to form a composite panel 309 (FIG. 3(b)) before being singulated by mechanical tools. Singulated micro relays 311 (FIG. 3(c)) function as stand-alone devices.

Figure 4:
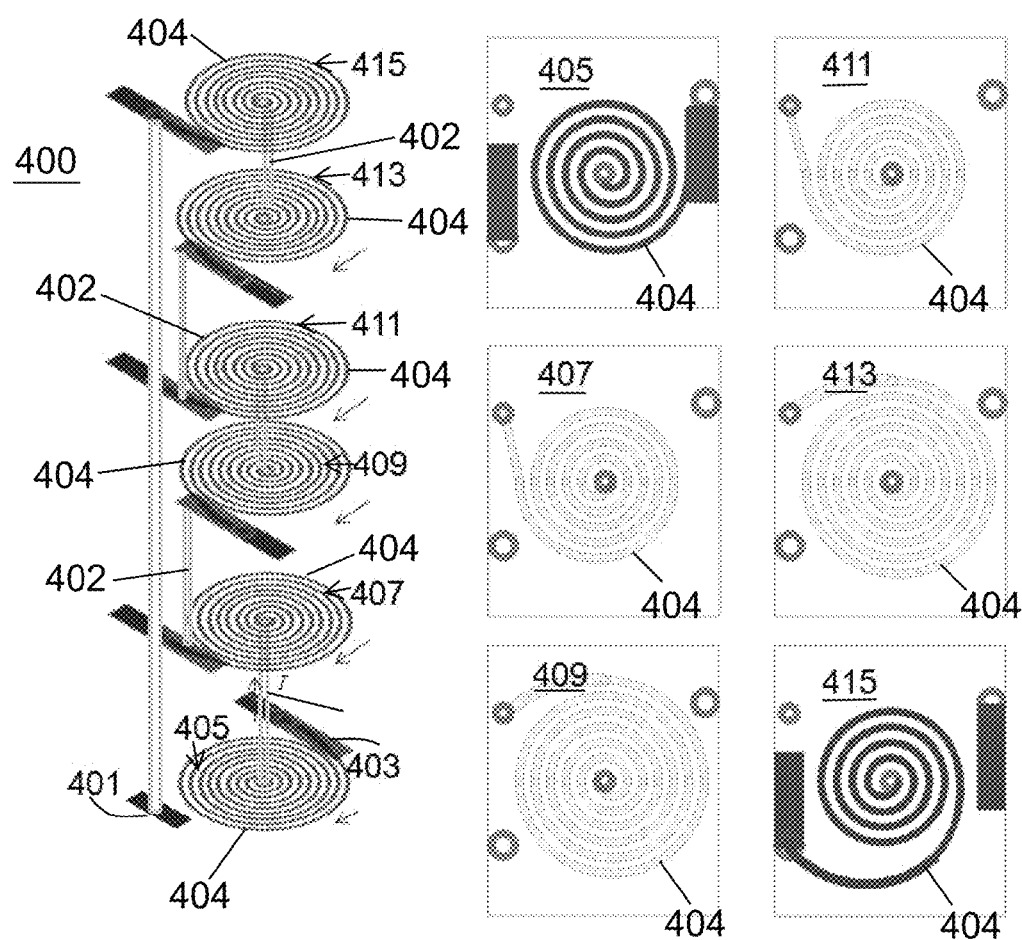
FIG. 4 illustrates the use of conventional printed circuit board multi-layer process for building multiple layered electromagnetic coils within printed circuit boards.

As shown in FIG. 4, electromagnetic coils 400 are fabricated using conventional printed circuit board multi-layer processes. Spiral coils 404 on one layer direct the electric current to rotate clockwise or counter clockwise. Each layer 405-415 alternates spiral directions in order to maintain the same direction of electric current. Two contact pads 401, 403 are used as current terminals. Via holes 402 through layers are used to connect adjacent spirals 404. Up to 32 layers of electromagnetic coils can be fabricated by conventional printed circuit boards factories.

Figure 5:
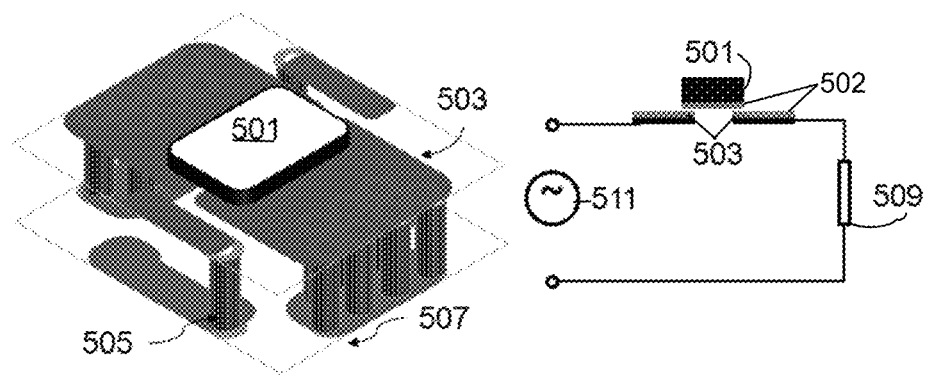
FIG. 5 illustrates a device and method of closing and opening electric circuits using a magnetic contact and electrodes on printed circuit boards.

Referring to FIG. 5, line power up to 120 V peak voltage and 10 A peak current 511 can be conducted through electrodes 503 through a magnetic contacts 501 that are latched to "close" state. The contact surfaces between the magnet 501 and electrodes 503 are coated with low resistance, low adhesion force material 502, such as gold nitride and platinum alloy, which are durable for millions of hot switching operations. The conductive via 505, filled or unfilled, make electrical connection from the packaged electrodes 503 to exposed surface mountable pads 507.

Figure 6:
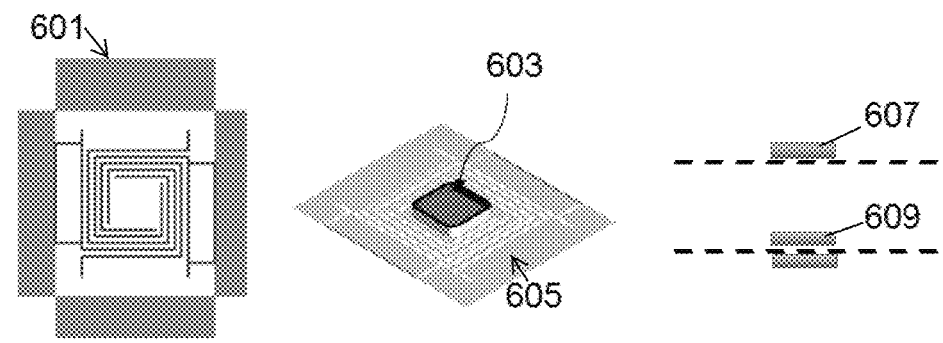
FIG. 6 illustrates the use of low spring constant tethering for actuating magnet contact.

As shown in FIG. 6, highly flexible and durable thin film material, such as polyimide and polyester, can be cut according to designed patterns 601 by focused CO2 laser cutter that are commercially available. A magnet 603 is attached to the processed spring 605 using adhesives. Single sided 607 and double sided 609 attachments are useful for single and double state switch designs, respectively.

Figure 7:
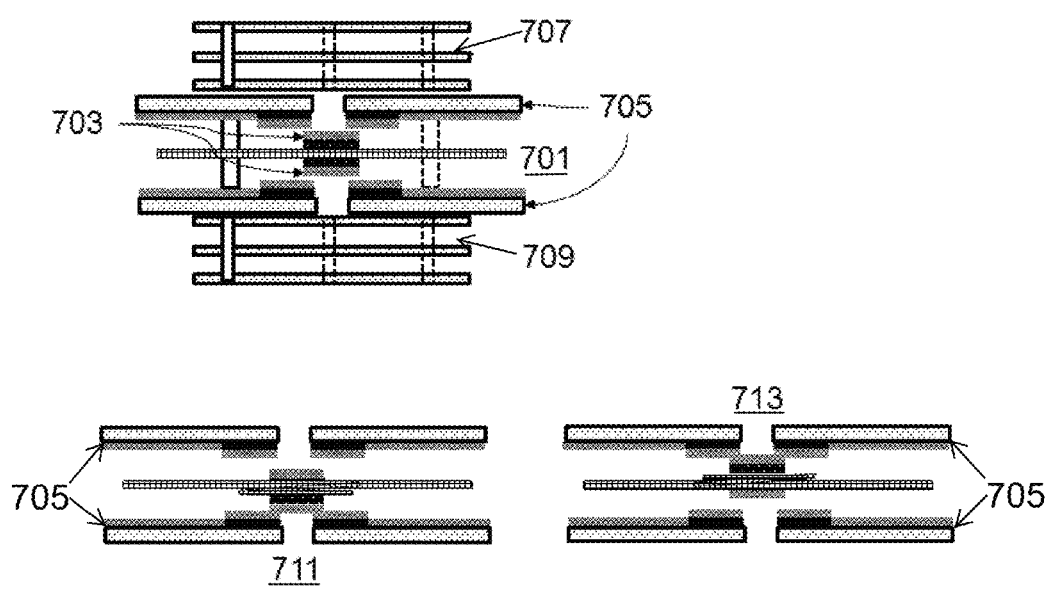
FIG. 7 illustrates dual-state latching micro relays.

Turning to FIG. 7, dual-state latching micro relays 701 consist of two sets of electromagnetic coils 707, 709 and two sets of contact electrodes 705. The magnet and spring load mechanism 703 can be actuated to latch on both top 713 and bottom 711, resulting in opening and closing of opposing electrodes 705.

Figure 8:
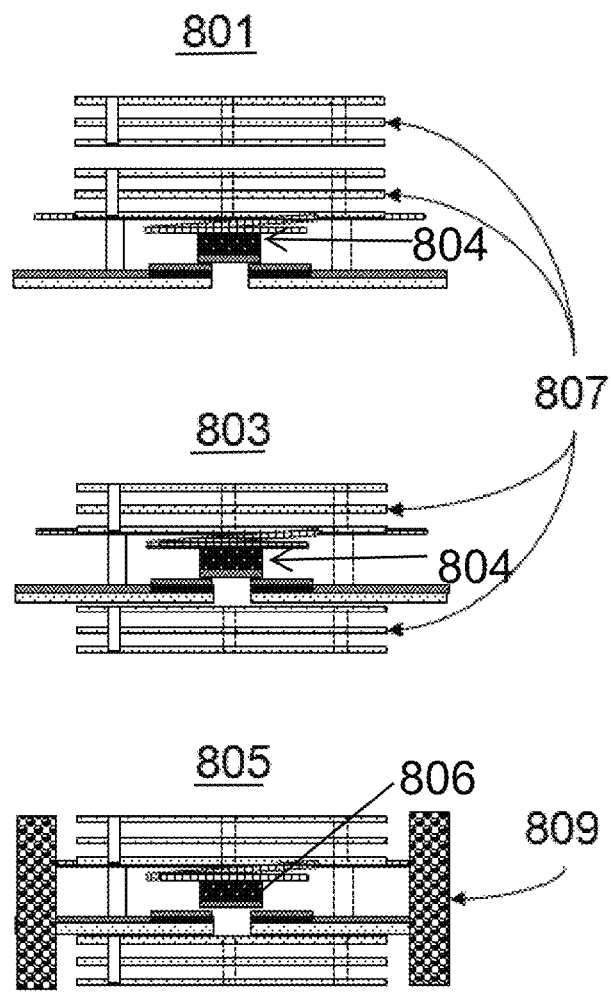
FIG. 8 illustrates multiple sets of electromagnetic coils built within the same micro relay coils to produce intensive magnetic fields.

As shown on FIG. 8, multiple sets of electromagnetic coils 807 can be built within the same micro relay 801 to gain stronger magnetic force to actuate relays with stronger latching force. In another device 803, the coils 807 can locate on either side of the armature 804 for focused magnetic field flux. In a further device 805, magnetic field shaping material 809, such as permalloy, is used to further confine the magnetic field flux to most effectively drive the floating magnet contact 806.

Figure 9:
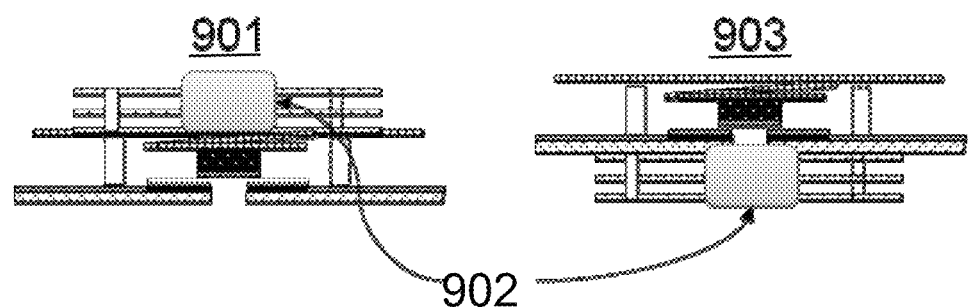
FIG. 9 illustrates electromagnetic coils with an iron core to produce Normally Open and Normally Close micro relays with significantly increased the magnetic force on the magnet contact.

As shown in FIG. 9, iron cores 902 in the center of the electromagnetic coil 907 can significantly increase the magnetic force on the magnet contact 906. The paramagnetic property of iron cores 902 causes the magnet contact 906 to latch on to the core 902 side, resulting in "Normally Open" 901 and "Normally Close" 903 micro relay configurations.

Figure 10:
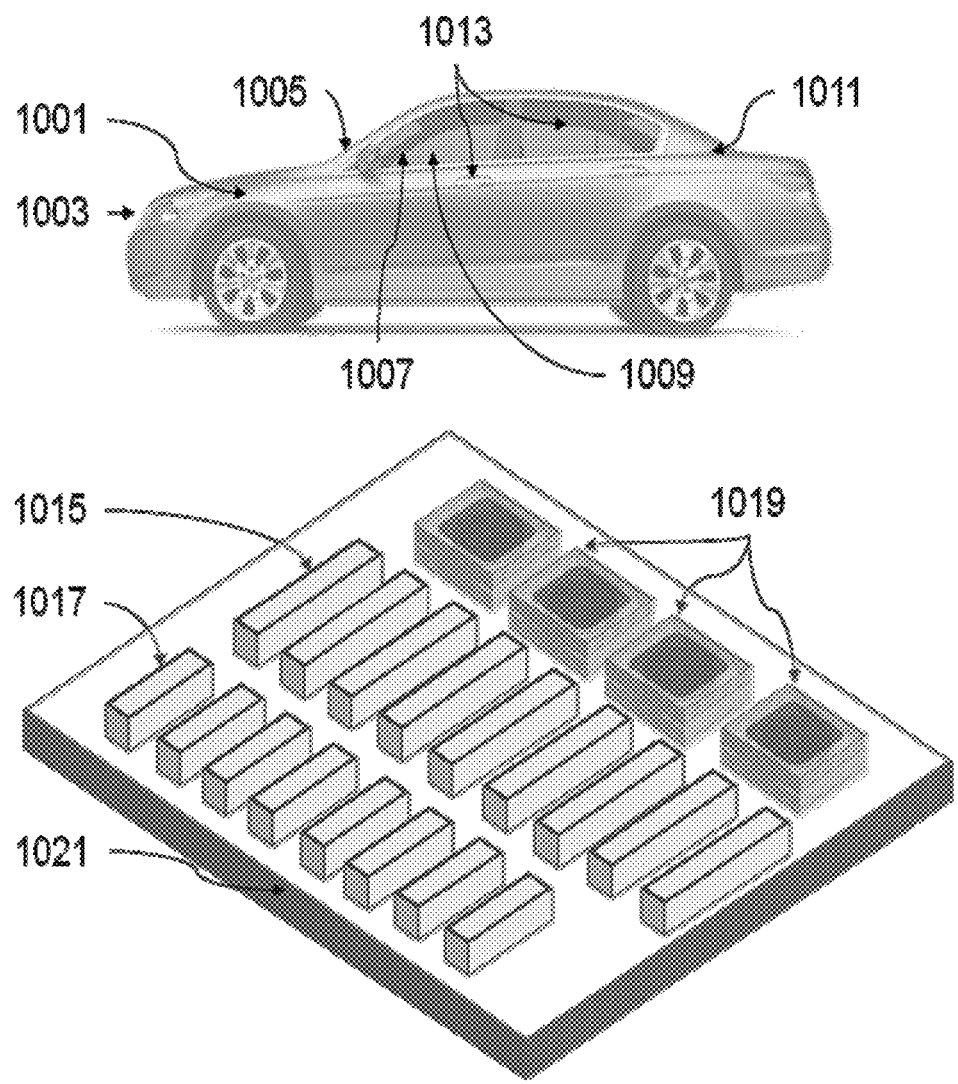
FIG. 10 illustrates micro relays fabricated in laminates for use as automobile relays.

Turning to FIG. 10, two types of automotive relays can be manufactured in accordance with the illustrative embodiments: standalone and embedded. In a typical sedan, over twenty standalone micro relays control functions such as wipers 1005, flashers 1003, power steering 1007, door locks 1013, dashboard electronics 1009, and defogger 1011. The embedded micro relays 1019 and switches 1015 and 1017 replace the traditional automobile relay box 1001 with a relay board 1021.

Figure 11:
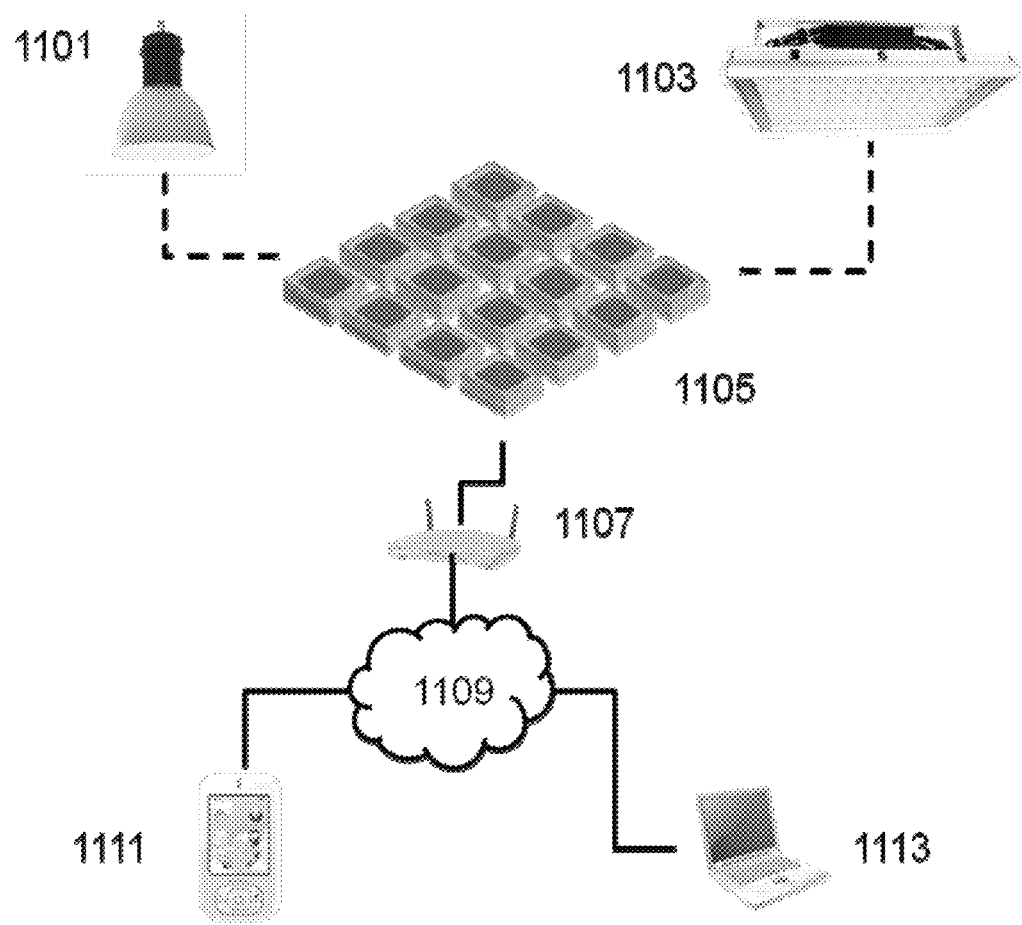
FIG. 11 illustrates micro relays fabricated in laminates for use in home and industrial lighting control.

In FIG. 11, an illustrated embodiment is a multi-channel lighting control box 1105 with a number of micro relays described herein. A single 1101 or a panel 1103 of lights, such as incandescent, mercury and LED, can be controlled by a single relay unit. The control box 1105 receives commands from the users through the internet 1109 enabled interface such as a smart cellular phone 1111 and a personal computer 1113.

While the invention is susceptible to various modifications, and alternative forms, specific examples thereof have been shown in the drawings and are herein described in detail. It should be understood, however, that the invention is not to be limited to the particular forms or methods disclosed, but to the contrary, the invention is to cover all modifications, equivalents and alternatives falling within the spirit and scope of the appended claims.

What is claimed:

1. A latching micro-electro-mechanical relay switch comprising:
    a first laminate layer comprising a moveable component having a spring and a magnet,
    a second laminate layer with a coil for providing electromagnetic energy to actuate the moveable component, and
    a third laminate layer with a magnetic material to hold the magnet of the moveable component and latching it into an "on" state,
    wherein the magnet is driven to the latched "on" state when a pulsed current passes through the coil and driven to a delatched state when the pulsed current is reversed through the coil,
    wherein the first laminate layer, second laminate layer, and third laminate layer are separate and distinct layers, and
    wherein the first laminate layer is positioned in between the second laminate layer and the third laminate layer.
2. The switch of claim 1 wherein the first, second and third laminate layers are laminated together to form a complete assembly.
3. The switch of claim 1, wherein the coil is a multi-turn, six layer coil.
4. The switch of claim 3, wherein the coil is a six layer coil.
5. The switch of claim 1, wherein the moveable component comprises a polyimide spring.
6. The switch of claim 1, wherein the third laminate layer comprises a transmission/signal line.
7. The switch of claim 6, wherein the transmission/signal line includes contact pads.
8. The switch of claim 6, wherein the magnetic material is positioned under the contact pads to provide magnetic latching.
9. The switch of claim 1, wherein contact surfaces between the magnet and contact pads are coated with a conductive element coating.
10. The switch of claim 1, further comprising:
    a second electromagnetic coil for providing electromagnetic energy to actuate the moveable component, wherein the magnet and spring are actuated to latch the magnet on both the top and bottom of the switch.
11. A standalone automotive micro relay control switch, comprising a switch according to claim 1.
12. A switch according to claim 9, applied as a standalone micro relay control function selected from the group comprising windshield wipers, flashers, power steering, door locks, dashboard electronics, and defogger.
13. An embedded automotive micro relay control switch, comprising a switch according to claim 1.
14. A multi-channel lighting control box, comprising at least one switch according to claim 1.
15. The multi-channel lighting control box according to claim 11, configured to control one or more light.
16. The multi-channel lighting control box according to claim 11, configured to control a panel of lights.
17. The multi-channel lighting control box according to claim 11, configured to receive commands from a computing device via a network.
18. A single pole, single throw (SPST) electromagnetic micro relay comprising
    a plurality of laminate layers,
    a movable component having a spring and magnet in a first laminate layer of the plurality of laminate layers,
    a magnetic material in a second laminate layer of the plurality of laminate layers, and
    an electromagnetic actuation mechanism in a third laminate layer of the plurality of laminate layers, wherein the movable component is actuated by the mechanism to pull the movable component close enough to the magnetic material to latch the movable component in an "on" state,
    wherein the first laminate layer, second laminate layer, and third laminate layer are separate and distinct layers, and
    wherein the first laminate layer is positioned in between the second laminate layer and the third laminate layer.
19. The SPST of claim 18 wherein the electromagnetic actuation mechanism includes an electromagnetic coil in the third laminate layer of the plurality of laminate layers.
20. The SPST of claim 19 further comprising an iron core positioned within the electromagnetic coil.

* * * * *